US011945987B2

(12) United States Patent
Takaku et al.

(10) Patent No.: US 11,945,987 B2
(45) Date of Patent: Apr. 2, 2024

(54) LIGHT WAVELENGTH CONVERSION MEMBER AND LIGHT-EMITTING DEVICE

(71) Applicant: NGK SPARK PLUG CO., LTD., Nagoya (JP)

(72) Inventors: Shohei Takaku, Nagoya (JP); Yusuke Katsu, Nagoya (JP); Tsuneyuki Ito, Nagoya (JP); Toshiaki Kurahashi, Nagoya (JP); Hideto Yamada, Nagoya (JP)

(73) Assignee: NITERRA CO., LTD., Nagoya (JP)

(*) Notice: Subject to any disclaimer, the term of this patent is extended or adjusted under 35 U.S.C. 154(b) by 741 days.

(21) Appl. No.: 16/973,367

(22) PCT Filed: Jul. 17, 2019

(86) PCT No.: PCT/JP2019/028161
§ 371 (c)(1),
(2) Date: Dec. 8, 2020

(87) PCT Pub. No.: WO2020/026819
PCT Pub. Date: Feb. 6, 2020

(65) Prior Publication Data

US 2021/0324266 A1 Oct. 21, 2021

(30) Foreign Application Priority Data

Jul. 31, 2018 (JP) ................................ 2018-143791

(51) Int. Cl.
*C09K 11/77* (2006.01)
*C04B 35/10* (2006.01)
*C09K 11/02* (2006.01)
*H01L 33/50* (2010.01)

(52) U.S. Cl.
CPC .......... *C09K 11/7774* (2013.01); *C04B 35/10* (2013.01); *C09K 11/02* (2013.01); *H01L 33/502* (2013.01); *C04B 2235/3222* (2013.01); *H01L 2933/0041* (2013.01)

(58) Field of Classification Search
CPC ..... C09K 11/7774; C09K 11/02; C04B 35/64; C04B 2235/6565; C04B 2235/3225; C04B 2235/3229
See application file for complete search history.

(56) References Cited

U.S. PATENT DOCUMENTS

| | | | | |
|---|---|---|---|---|
| 2006/0124951 | A1 | 6/2006 | Sakata et al. | |
| 2006/0250069 | A1* | 11/2006 | Sakata | C09K 11/7774 313/485 |
| 2011/0210658 | A1 | 9/2011 | Pan et al. | |
| 2013/0256599 | A1 | 10/2013 | Irie | |
| 2015/0247618 | A1 | 9/2015 | Irie | |
| 2015/0329778 | A1 | 11/2015 | Menke et al. | |

FOREIGN PATENT DOCUMENTS

| | | | |
|---|---|---|---|
| EP | 3534190 | A1 | 9/2019 |
| EP | 3534193 | A1 | 9/2019 |
| JP | 2008-231218 | A | 10/2008 |
| JP | 2013-518797 | A | 5/2013 |
| JP | 2014-132084 | A | 7/2014 |
| JP | 2016-138034 | A | 8/2016 |
| JP | 2017-197774 | A | 11/2017 |
| JP | 2018-109664 | A | 7/2018 |
| JP | 2018109664 | A * | 7/2018 |
| WO | 2004-065324 | A1 | 5/2006 |
| WO | 2018-079419 | A1 | 5/2018 |
| WO | 2018-079421 | A1 | 5/2018 |

OTHER PUBLICATIONS

JP2018109664 English Machine Translation, prepared Oct. 20, 2023. (Year: 2023).*
Atomic Radius in the Periodic Table, Downloaded from PubMed Oct. 20, 2023. (Year: 2023).*
The State Intellectual Property Office of People's Republic of China, The Second Office Action issued in corresponding Application No. 201980049392.1 dated Jul. 14, 2022.
Japan Patent Office, International Search Report issued in corresponding Application No. PCT/JP2019/028161, dated Sep. 17, 2019.
Japan Patent Office, Office Action (Notice of Reasons for Refusal) issued in corresponding Application No. JP 2019-568123, dated Mar. 10, 2020.
European Patent Office, Supplementary European Search Report issued in corresponding Application No. EP 19844610 dated Mar. 18, 2022.
Korean Intellectual Property Office, Office Action (Request for the Submission of an Opinion) issued in corresponding Application No. KR 10-2021-7000580 dated Sep. 5, 2022.

* cited by examiner

*Primary Examiner* — Christopher M Rodd
(74) *Attorney, Agent, or Firm* — Stites & Harbison, PLLC; Jeffrey A. Haeberlin; Trevor T. Graves

(57) ABSTRACT

In one aspect of the present disclosure, there is provided an optical wavelength conversion member including a polycrystalline ceramic sintered body containing, as main components, $Al_2O_3$ crystal grains and crystal grains represented by formula $X_3Al_5O_{12}$:Ce. In the optical wavelength conversion member 9, atoms of element X are present also in an $Al_2O_3$ crystal grain adjacent to the interface between the $Al_2O_3$ crystal grain and an $X_3Al_5O_{12}$:Ce crystal grain.

2 Claims, 2 Drawing Sheets

LIGHT WAVELENGTH CONVERSION MEMBER AND LIGHT-EMITTING DEVICE

CROSS-REFERENCE TO RELATED APPLICATIONS

This international application claims priority to Japanese Patent Application No. 2018-143791 filed in the Japan Patent Office on Jul. 31, 2018, the entire content of which is incorporated herein by reference.

TECHNICAL FIELD

The present disclosure relates to an optical wavelength conversion member and a light-emitting device, each of which can convert light wavelength and is used for, for example, wavelength conversion apparatuses, fluorescent materials, lighting apparatuses, and video apparatuses.

BACKGROUND ART

A head lamp, a projector, a lighting apparatus, or a similar apparatus generally includes a device for achieving white light through wavelength conversion, by means of a fluorescent body (i.e., a wavelength conversion member), of blue light emitted from a light-emitting diode (LED) or a laser diode (LD).

Hitherto, the matrix or material of the fluorescent body (or a phosphor) has been, for example, a resin material or a glass material. In accordance with a trend for using a high-output light source in recent years, the phosphor is required to have higher durability. Thus, ceramic phosphors have received attention.

Known ceramic phosphors are formed of a Ce-activated garnet ($A_3B_5O_{12}$) component, such as $Y_3Al_5O_{12}$:Ce (YAG: Ce).

For example, Patent Documents 1 and 2 disclose a technique for forming an $Al_2O_3$—YAG:Ce composite material exhibiting improved heat resistance and thermal conductivity.

PRIOR ART DOCUMENTS

Patent Documents

Patent Document 1: Japanese Patent Application Laid-Open (kokai) No. 2014-132084

Patent Document 2: International Publication WO 2004/065324

SUMMARY OF THE INVENTION

Problem to be Solved by the Invention

According to the techniques disclosed in Patent Documents 1 and 2, an $Al_2O_3$-YAG:Ce composite material is formed from $Al_2O_3$ particles and YAG:Ce particles during production of a phosphor. However, the techniques may cause the problems described below due to a large difference in lattice constant between $Al_2O_3$ and YAG.

When adjacent crystal grains exhibit a lattice mismatch (i.e., a large difference in lattice constant) at the interface between the crystal grains (i.e., grain boundary), a defect (e.g., dislocation) may occur at the interface.

When such a defect occurs, the defect becomes a non-luminescent recombination center (i.e., a site where energy is converted not into light but into, for example, heat), which causes a reduction in internal quantum efficiency (i.e., emission efficiency). The term "internal quantum efficiency" as used herein refers to the ratio of the number of generated photons to the number of injected and recombined electrons.

For example, the technique disclosed in Patent Document 1 involves preparation of a phosphor using eutectic transformation of $Al_2O_3$ and YAG (each of which is in a single-crystal form). Thus, a large difference in lattice constant between $Al_2O_3$ and YAG may cause a reduction in internal quantum efficiency.

The technique disclosed in Patent Document 2 causes precipitation of a $CeAl_{11}O_{18}$ phase (i.e., a third component) during production of an $Al_2O_3$-YAG composite phosphor. The third component has a lattice constant smaller than that of $Al_2O_3$. This causes a larger difference in lattice constant, possibly resulting in a reduction in internal quantum efficiency.

Thus, according to the aforementioned conventional techniques, a large difference in lattice constant between $Al_2O_3$ and YAG may cause a problem in terms of low emission efficiency (i.e., impairment of fluorescent characteristics) due to a reduction in internal quantum efficiency.

In one aspect of the present disclosure, there is preferably provided an optical wavelength conversion member and a light-emitting device, each, of which exhibits high internal quantum efficiency and superior fluorescent characteristics.

Means for Solving the Problem (1) One aspect of the present disclosure is directed to an optical wavelength conversion member comprising a polycrystalline ceramic sintered body containing, as main components, $Al_2O_3$ crystal grains and crystal grains represented by formula $X_3Al_5O_{12}$:Ce.

In the optical wavelength conversion member, X of $X_3Al_5O_{12}$:Ce is at least one element selected from the following element group:

X: lanthanoids (except for Ce), Y, and Sc; and atoms of element X are present also in an $Al_2O_3$ crystal grain adjacent to the interface between, the $Al_2O_3$ crystal grain and an $X_3Al_5O_{12}$:Ce crystal grain.

In the optical wavelength conversion, member, as described above, atoms of element X are present also in an $Al_2O_3$ crystal grain adjacent to the interface between, the $Al_2O_3$ crystal grain and an $X_3Al_5O_{12}$:Ce crystal grain (i.e., atoms of element X are incorporated into the $Al_2O_3$ crystal grain through atomic, substitution). Thus, the optical wavelength conversion member exhibits high internal quantum efficiency and superior fluorescent characteristics (i.e., high emission intensity).

More specifically, since the optical wavelength conversion member has the aforementioned structure, lattice mismatch is mitigated at the interface between an $Al_2O_3$ crystal grain and an $X_3Al_5O_{12}$:Ce crystal grain. Thus, defects are reduced at the interface, and the influence of a non-luminescent recombination center is suppressed, resulting in improved internal quantum efficiency (i.e., improved emission efficiency).

Consequently, fluorescent characteristics (specifically, emission intensity) are improved. Also, temperature rise can be prevented, since internal quantum efficiency is improved, and energy can be converted efficiently into light without conversion to heat. Therefore, temperature quenching (i.e., thermal quenching) can be reduced, thus improving heat resistance.

In the optical wavelength conversion, member, the ceramic sintered body has a garnet structure represented by $X_3B_5O_{12}$:Ce (wherein B is Al), wherein X is at least one element selected from the aforementioned element group. This structure enables efficient conversion of blue light into visible light.

(2) In the optical wavelength conversion member, atoms of element X may be present at depths of 1 nm to 20 nm as measured from the surface of the $Al_2O_3$ crystal, grain adjacent to the interface.

When atoms of element X are present (through atomic substitution) at depths of 1 nm or more as measured from the surface of the $Al_2O_3$ crystal grain, lattice mismatch at the interface can be further mitigated. Thus, defects are further reduced at the interface (grain boundary), and the influence of a non-luminescent recombination center is greatly suppressed, leading to a considerable improvement in internal quantum efficiency (i.e., emission efficiency). Since temperature quenching can also be further reduced, heat resistance is greatly improved.

Meanwhile, when atoms of element X are present (through atomic substitution) at depths greater than 20 nm as measured from the surface of the $Al_2O_3$ crystal grain, the effect of mitigating lattice mismatch is suppressed at the interface between, the $Al_2O_3$ crystal grain and the $X_3Al_5O_{12}$:Ce crystal grain, resulting in less improvement in the aforementioned characteristics.

Therefore, preferably, atoms of element X are present in the aforementioned region (i.e., at depths of 1 nm to 20 nm as measured from the surface of the $Al_2O_3$ crystal grain).

In the case of determination of a region where atoms of element X are present, measurement can be performed at a plurality of (e.g., five or more) positions in one $Al_2O_3$ crystal grain, and the measurement can be performed in a plurality of (e.g., five or more) $Al_2O_3$ crystal grains, followed by calculation of the average of the resultant measurements.

(3) The aforementioned optical wavelength conversion, member comprises the aforementioned optical wavelength conversion member and a light-emitting element.

The light (i.e., fluorescence) having a wavelength converted by means of the light-emitting device (specifically, the optical wavelength conversion member) exhibits high emission intensity. The optical wavelength conversion member exhibits high heat resistance.

The light-emitting element of the light-emitting device may be any known element, such as an LED or LD, Characteristic Features of the Present Disclosure Will Now be Described>

The term "main component" refers to any component present in a predominant amount (i.e., volume) in the optical wavelength conversion member. For example, the optical wavelength conversion member may contain $Al_2O_3$ crystal grains as translucent grains and crystal grains represented by formula $X_3Al_5O_{12}$:Ce (i.e., $X_3Al_5O_{12}$:Ce crystal grains) as fluorescent grains in a total amount of 50 vol. % or more (preferably 90 vol. % or more).

The formula "$X_3Al_5O_{12}$:Ce" refers to a compound in which a portion of element X contained in $X_3Al_5O_{12}$ is substituted by Ce through formation of a solid solution. The compound having such a structure exhibits fluorescent characteristics.

In $X_3Al_5O_{12}$:Ce crystal grains, Y may be essential as element X.

Examples of the lanthanoid (except for Ce) include La, Pr, Nd, Pm, Sm, Eu, Gd, Tb, Dy, Ho, Er, Tm, Yb, and Lu.

When the total amount of $Al_2O_3$ crystal grains and $X_3Al_5O_{12}$:Ce crystal grains is 100 vol. %, the amount of $X_3Al_5O_{12}$:Ce crystal grains may be, for example, 3 vol. % to 70 vol. %.

Whether or not element X is contained in an $Al_2O_3$ crystal grain adjacent to the interface between the $Al_2O_3$ crystal grain and an $X_3Al_5O_{12}$:Ce crystal grain (i.e., the presence of X in the $Al_2O_3$ crystal grain) can be detected in, for example, a region extending inward from the surface of the $Al_2O_3$ crystal grain, by a distance of 25 nm or less through, for example, HAADF-STEM (high-angle annular dark-field scanning transmission electron microscopy).

DESCRIPTION OF REFERENCE NUMERALS

1: light-emitting device
5: light-emitting element
9: optical wavelength conversion member

MODES FOR CARRYING OUT THE INVENTION

Next will be described embodiments of the optical wavelength conversion member and light-emitting device of the present disclosure.

1. Embodiment

[1-1. Light-Emitting Device]

Now will be described a light-emitting device including an optical wavelength conversion member according to the present embodiment.

Figure 1:
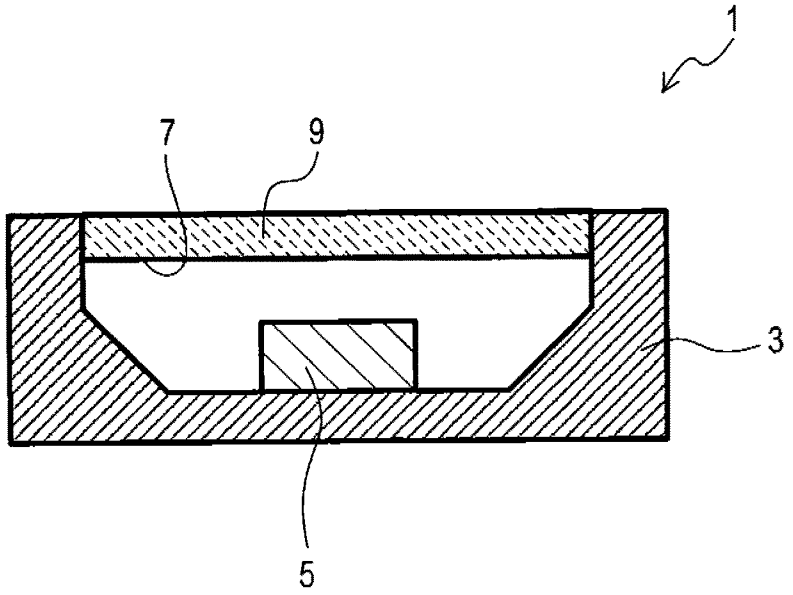
FIG. 1 Cross-sectional view (in a thickness direction) of a light-emitting device.

As illustrated in FIG. 1, a light-emitting device 1 of the present embodiment includes a box-shaped ceramic package (container) 3 formed of, for example, alumina; a light-emitting element 5 (e.g., LD) disposed in the interior of the container 3; and a plate-like optical wavelength conversion member 9 disposed so as to cover an opening 7 of the container 3.

In the light-emitting device 1, light emitted from the light-emitting element 5 transmits through the translucent optical wavelength conversion member 9, and the wavelength of a portion of the emitted light is converted in the interior of the optical wavelength conversion member 9. Thus, the optical wavelength conversion member 9 emits fluorescence having a wavelength different from that of the light emitted from, the light-emitting element 5.

For example, the optical wavelength conversion member 9 converts the wavelength of blue light emitted from an LD, whereby the optical wavelength conversion member 9 as a whole emits white light to the outside (e.g., upward in FIG. 1).

[1-2. Optical Wavelength Conversion Member]

The optical wavelength conversion member 9 will next be described.

The optical wavelength conversion member 9 of the present embodiment is composed of a polycrystalline ceramic sintered body containing, as main components, $Al_2O_3$ crystal grains (i.e., translucent grains) and crystal grains represented by formula $X_3Al_5O_{12}$:Ce (i.e., $X_3Al_5O_{12}$:Ce crystal grains: fluorescent grains).

In the optical wavelength conversion, member 9, X of $X_3Al_5O_{12}$:Ce is at least one element selected from the following element group. That is, the ceramic sintered body has a so-called garnet structure.

X: lanthanoids (except for Ce), Y, and Sc.

In the optical wavelength conversion member 9, atoms of element X are present also in an $Al_2O_3$ crystal grain adjacent to the interface between the $Al_2O_3$ crystal grain and an $X_3Al_5O_{12}$:Ce crystal grain.

Furthermore, atoms of element X (e.g., atoms of Y) are present in a region extending inward from the surface of the $Al_2O_3$ crystal grain adjacent to the aforementioned interface by a distance of, for example, 25 nm or less. Preferably, atoms of element X (e.g., atoms of Y) are present at distances of 1 nm to 20 nm as measured from the surface of the $Al_2O_3$ crystal grain.

Notably, the formula $X_3Al_5O_{12}$:Ce corresponds to a combination of elements (note: different elements) forming a substance represented by the formula $X_3Al_5O_{12}$:Ce, wherein O is oxygen and Ce is cerium.

In the optical wavelength conversion member 9, the total amount of $Al_2O_3$ crystal grains and $X_3Al_5O_{12}$:Ce crystal grains is, for example, 50 vol. % or more (preferably 90 vol. % or more, more preferably 100 vol. %); for example, 99 vol. %.

When the total amount of $Al_2O_3$ crystal grains and $X_3Al_5O_{12}$:Ce crystal grains is 100 vol. %, the amount of $X_3Al_5O_{12}$:Ce crystal grains is 3 vol. % to 70 vol. %; for example, 30 vol. %.

In the optical wavelength conversion member 9, the Ce concentration of $X_3Al_5O_{12}$:Ce is 5 mol % or less (exclusive of 0) relative to element X.

[1-3. Production Method for Optical Wavelength Conversion Member]

A process for producing the optical wavelength conversion member 9 will now be briefly and schematically described with reference to FIG. 2.

As detailed below in Experimental Examples, the optical wavelength conversion member 9 is produced by means of reaction sintering.

Figure 2:
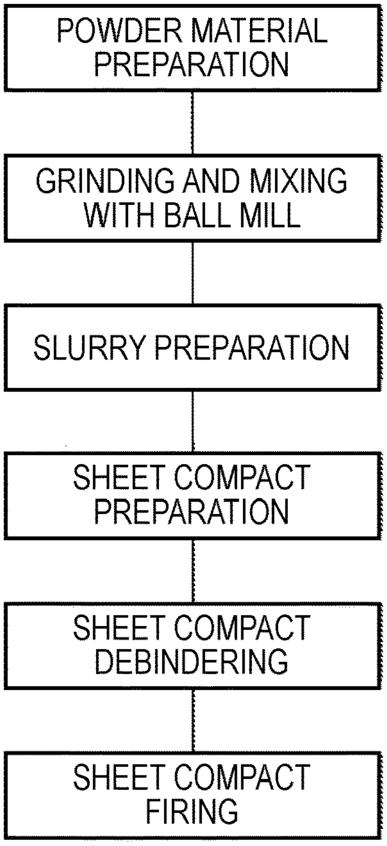
FIG. 2 Flow chart showing a production process for an optical wavelength conversion member of an embodiment.

As illustrated in FIG. 2, powder materials for the optical wavelength conversion member 9 (i.e., ceramic sintered body) were weighed so as to satisfy the aforementioned requirement of the embodiment (i.e., the powder materials were prepared).

Subsequently, an organic solvent and a dispersant were added to the prepared powder materials, and these materials were ground and mixed in a ball mill.

Subsequently, the powder prepared through grind-mixing was mixed with a resin, to thereby prepare a slurry.

The slurry was then formed into a sheet compact through doctor blading.

The sheet compact was then debindered.

The debindered sheet compact was fired in a firing-atmosphere having a pressure of $10^4$ Pa or more and an oxygen concentration of 0.8 vol. % to 21 vol. % for a predetermined period of time. The ceramic sintered body was thereby produced.

[1-4. Effects]

The effects of the present embodiment will now be described.

(1) In the optical wavelength conversion member 9 of the present embodiment, atoms of element X are present also in an $Al_2O_3$ crystal grain adjacent to the interface (i.e., first crystal grain boundary) between the $Al_2O_3$ crystal grain and an $X_3Al_5O_{12}$:Ce crystal grain. Thus, the optical wavelength conversion member exhibits high internal quantum efficiency and superior fluorescent characteristics (i.e., high emission intensity).

Specifically, since a portion of elements forming $Al_2O_3$ crystal grains is substituted by atoms of element X during production of the optical wavelength conversion member 9, lattice mismatch is mitigated at the interface between an $Al_2O_3$ crystal grain and an $X_3Al_5O_{12}$:Ce crystal grain. Thus, defects are reduced at the interface, and the influence of a non-luminescent recombination center is suppressed, resulting in improved, internal quantum efficiency (i.e., improved, emission efficiency).

Consequently, fluorescent characteristics (specifically emission intensity) are improved. Also, temperature rise can be prevented, since internal quantum efficiency is improved, and energy can be efficiently converted into light without conversion to heat. Therefore, temperature quenching can be reduced, and thus heat resistance is improved.

(2) In the present embodiment, atoms of element X are present at depths of 1 nm to 20 nm as measured from the surface of the $Al_2O_3$ crystal grain adjacent to the aforementioned interface.

Therefore, lattice mismatch at the interface can be further mitigated. Thus, defects are further reduced at the interface (grain boundary), and the influence of a non-luminescent recombination center is greatly suppressed, leading to a considerable improvement in internal quantum efficiency (i.e., emission efficiency). Since temperature quenching can also be further reduced, neat resistance is greatly improved.

(3) In the present embodiment, the ceramic sintered body has a garnet structure represented by $X_3Al_5O_{12}$:Ce wherein X is at least, one element selected from the aforementioned element group. This structure enables efficient conversion of blue light into visible light.

(4) The light (i.e., fluorescence) having a wavelength converted by means of the light-emitting device 1 (specifically, the optical wavelength conversion member 9) of the present embodiment exhibits high emission intensity and high color uniformity.

2. Experimental Examples

Next, will be described, for example, specific examples of the aforementioned embodiment.

Optical wavelength conversion member samples (Nos. 1 to 10) shown in Table 1 below were prepared.

Samples Nos. 1 to 6 and 8 to 10 fall within the scope of the present disclosure (Examples), and sample No. 7 falls outside the scope of the present disclosure (Comparative Example).

[2-1. Evaluation of Samples]

As described below, the samples were evaluated for the following items.

<Open Porosity>

The open porosity of the ceramic sintered body of the optical wavelength conversion member of each sample was determined through the method according to JIS R1634, <Determination of Ions Present at Grain Boundary and Vicinity Thereof>

The ceramic sintered body of the optical wavelength conversion member of each sample was subjected to mechanical polishing, to thereby form, a disk (ϕ: 3 mm, thickness: t=50 to 100 μm). Subsequently, the center of the disk was subjected to dimpling, and then a through hole was provided in the center through ion milling, to thereby prepare a sample for STEM (scanning transmission electron microscopy).

As described below, STEM observation was performed at a thinnest portion around the through hole (opening) of the above-prepared sample for STEM.

The observation was performed at a first crystal grain boundary (i.e., the interface between an $Al_2O_3$ crystal grain and an $X_3Al_5O_{12}$:Ce crystal grain) and at a second crystal grain boundary (i.e., the interface between, two $Al_2O_3$ crystal grains).

Specifically, the orientation was adjusted so as to determine the atomic arrangement of Al of $Al_2O_3$ at the aforementioned first and second crystal grain boundaries while searching for a site where the atomic arrangement of the adjacent crystal grain was able to be observed, and the atomic arrangement of Al of $Al_2O_3$ crystal grain was observed in an HAADF-STEM image having an atomic-number-dependent brightness, to thereby determine the presence or absence of atomic substitution, of another element (e.g., Y of element X) in the Al atomic arrangement.

The HAADF-STEM observation of the atomic arrangement was performed by means of a high-resolution STEM equipped with a Cs corrector. The presence or absence of an element (other than Al) at the second crystal grain boundary was non-quantitatively determined by means of an EDS (energy dispersive X-ray spectrometer).

<Determination of Position of X Substitutions>

The sample used for the aforementioned determination of the presence of ions was used to determine a position where elemental Y (of element X) was present in an $Al_2O_3$ crystal grain adjacent to the interface between the $Al_2O_3$ crystal grain and an $X_3Al_5O_{12}$:Ce crystal grain.

Specifically, line analysis was performed in the $Al_2O_3$ crystal grain adjacent to the aforementioned interface at a portion near the first crystal grain boundary, and determination of a region wherein elemental Y (of element X) was present was started from a point (reference interface) at which the EDS detection value (i.e., output value) of elemental Y was 50%. The line analysis was performed in a direction normal to the interface.

The measurement was performed at any 20 points along a line which extends across the interface between an $Al_2O_3$ crystal grain and an $X_3Al_5O_{12}$:Ce crystal grain in a direction normal to the interface. Thus, the average of detection values of elemental Y was determined. Subsequently, the measurement was performed in a plurality of (e.g., five) $Al_2O_3$ crystal grains, and the average of average detection values of elemental Y in these grains was calculated, to thereby determine a region of the presence of elemental Y.

<Internal Quantum Efficiency>

Optical wavelength conversion member samples (dimensions: 13 mm in width×13 mm in length×0.2 mm in thickness) were prepared.

The internal quantum efficiency of each sample was measured by means of a fluorescence spectrophotometer manufactured by JASCO Corporation. Blue LD light (i.e., laser light) having a wavelength of 465 nm was used as an excitation light source.

The internal quantum efficiency of each sample was evaluated by a value relative to the internal quantum efficiency (taken as 100) in the case where a single-crystal body (i.e., a YAG:Ce single-crystal body) was used. The internal quantum efficiency is preferably 97 or more, more preferably of 100 or more.

<Laser Output Tolerance>

Optical wavelength conversion member samples (dimensions: 13 mm in width×13 mm in length×0.2 mm in thickness) were prepared.

Blue LD light having a wavelength of 465 nm was focused to a width of 0.15 nm by means of a lens, and each sample was irradiated with the focused light. Light transmitted through the sample was focused with a lens, and the emission intensity was measured by means of a power sensor. The sample was irradiated with the blue LD light at a laser power density of 0 to 50 W/nm$^2$.

Occurrence of temperature quenching was determined when the emission intensity was reduced to 60% or less of that at a laser power density of 5 W/nm$^2$.

A sample exhibiting no temperature quenching at 50 W/mm$^2$ was evaluated as "Good" as shown in the column "LD output tolerance" of Table 2 below. A sample exhibiting no temperature quenching at 30 W/mm$^2$ or more and less than 50 W/mm$^2$ was evaluated as "Fair" as shown in the column "LD output tolerance" of Table 2. A sample exhibiting temperature quenching at less than 30 W/mm$^2$ was evaluated as "Fail" as shown in the column "LD output tolerance" of Table 2. A sample exhibiting no temperature quenching at 50 W/mm$^2$ or more is preferred in terms of laser output tolerance.

<Emission Intensity>

Optical wavelength conversion member samples (dimensions: 13 mm in width×13 mm in length×0.2 mm in thickness) were prepared.

Blue LD light (i.e., laser light) having a wavelength of 465 nm was focused to a width of 0.15 mm by means of a lens, and each sample was irradiated with the focused light. Light transmitted through the sample was focused with a lens, and the emission intensity was measured by means of a powder sensor. The sample was irradiated with the light at a laser power density of 40 W/mm$^2$.

The emission intensity of each sample was evaluated by a value relative to the emission intensity (taken as 100) in the case where a single-crystal body (i.e., a YAG:Ce single-crystal body) was used. The emission intensity is preferably 96 or more, more preferably 100 or more.

[2-2. Sample Production Method and Evaluation Results]

Next will be described a production method for each sample and the results of evaluation of the sample.

Example 1

Optical wavelength conversion members (samples Nos. 1 to 6) were prepared, under the conditions shown in Table 1 below. Specifically, optical wavelength conversion members (samples Nos. 1 to 6) were prepared through reaction sintering.

(1) Firstly, a ceramic sintered body (fluorescent body) was prepared through the procedure described below.

Specifically, as shown in Table 1, $Al_2O_3$ powder (mean particle size: 0.2 μm), $Gd_2O_3$ powder (mean particle size: 0.9 μm), and $CeO_2$ powder (mean particle size: 1.5 μm) were weighed so as to achieve the composition of the ceramic sintered body of each of samples Nos. 1 to 6.

The amount of $X_3B_5O_{12}$:Ce was maintained constant at 30 vol. % relative to the entire ceramic sintered body. As shown in Table 1, X is Y and Gd, and B is Al. Thus, $X_3B_5O_{12}$:Ce is $(Y,Gd)_3Al_5O_{12}$:Ce.

These powder materials were added to a ball mill together with ethanol, and these materials were grind-mixed for 16 hours. The resultant slurry was dried and formed into granules. A predetermined amount (2 wt. % of total) of a completely melted binder was added to the granules, and the mixture was thoroughly stirred and dried, to thereby yield a predetermined powder.

The resultant powder was subjected to press molding and then CIP molding, to thereby prepare a compact. The compact was debindered and then fired in an air atmosphere, to thereby prepare a ceramic sintered body (i.e., optical wavelength conversion member). This firing was performed under the following conditions: a firing temperature of 1,600° C., a retention time of 10 hours, and a modified temperature lowering rate.

(2) The optical wavelength conversion member of each sample was evaluated by the aforementioned evaluation methods. The results of evaluation are shown in FIG. 3 and Table 2 below.

Figure 3:
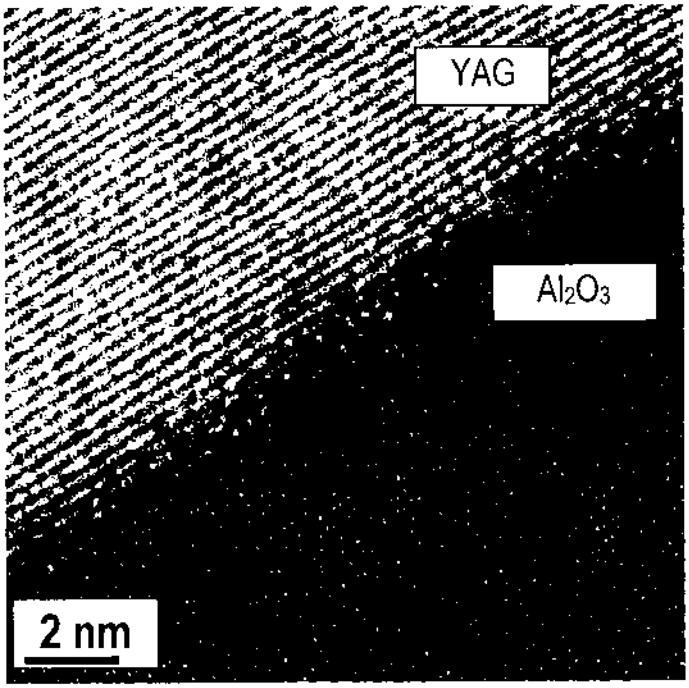
FIG. 3 Explanatory view showing a portion of an HAADF-STEM image of an optical wavelength conversion member of Example 1.

FIG. 3 shows an image obtained through HAADF-STEM observation. In FIG. 3, a bright and whitish area (represented by YAG) corresponds to a $(Y,Gd)_3Al_5O_{12}$:Ce crystal grain, whereas a dark and blackish area (represented by $Al_2O_3$) corresponds an $Al_2O_3$ crystal grain.

As is clear from FIG. 3, bright points corresponding to atoms of an element heavier than any of the elements forming $Al_2O_3$ are present in a portion of the $Al_2O_3$ crystal grain near the boundary (first crystal grain boundary: interface) between the $(Y,Gd)_3Al_5O_{12}$:Ce crystal grain and the $Al_2O_3$ crystal grain; i.e., bright points are present in the vicinity of the surface of the $Al_2O_3$ crystal grain.

The EDS analysis indicated that the bright points correspond to Y. Thus, Y was found to be present in the $Al_2O_3$ crystal grain adjacent to the first crystal grain boundary. In Table 2, “Presence” in the column “Determination of Y by EDS” indicates that Y is present in the $Al_2O_3$ crystal grain adjacent to the first crystal grain boundary.

Although not shown in Table 2, the presence of Gd was also confirmed in the $Al_2O_3$ crystal grain adjacent to the first crystal grain boundary.

Y and Gd (which are element X) were found to be present in a region extending inward from the surface of the $Al_2O_3$ crystal grain by a distance of 25 nm or less (i.e., a plurality of types of element X were dispersively present in this region). For example, element X was present at a depth of 2 nm as measured from the surface of the $Al_2O_3$ crystal grain.

Although not illustrated, the presence of Y was confirmed at the second crystal grain boundary (i.e., the interface between two $Al_2O_3$ crystal grains), but not determined in the $Al_2O_3$ crystal grains.

Thus, samples Nos. 1 to 6 are produced by the method (i.e., reaction sintering) described in Table 2.

Therefore, the presence of Y in the $Al_2O_3$ crystal grain adjacent to the first crystal grain boundary is probably attributed to that Y substitution occurs in the crystal grain during reaction sintering.

Conceivably, an increase in temperature lowering rate causes an increase in the distance between the surface of the $Al_2O_3$ crystal grain adjacent to the first crystal grain boundary and an interior portion of the crystal grain where atoms of Y are present through Y substitution.

As shown in Table 2, samples Nos. 1 to 6 are preferred in view that they exhibit an internal quantum efficiency of 97 or more and a high emission intensity of 96 or more because of the presence of Y in the $Al_2O_3$ crystal grain adjacent to the first crystal grain boundary. These samples are preferred in view that they exhibit an LD output tolerance of 30 $w/mm^2$ or more (evaluated as “Fair”) (i.e., low likelihood of temperature quenching).

As shown in Table 2, samples Nos. 2 to 5 are particularly preferred in view that Y is present (through elemental substitution) at depths of 1 nm to 20 nm as measured from the surface of the $Al_2O_3$ crystal grain adjacent to the first crystal grain boundary; hence they exhibit an internal quantum efficiency of 104 or more and a high emission intensity of 123 or more. These samples are preferred in view that they exhibit an LD output tolerance of 50 $W/nm^2$ or more (evaluated as “Good”) (i.e., low likelihood of temperature quenching).

Samples Nos. 1 to 6 are preferred in view that they exhibit an open porosity of 0.02% and a high relative density of 99% or more.

Comparative Examples

An optical wavelength conversion member (sample No. 7) was prepared under the conditions shown in Table 1 below.

The ceramic sintered body sample of Comparative Example 1 was prepared through a conventional mixing-system production method (see, for example, Patent Document 1).

Specifically, raw materials were weighed so as to achieve a composition of $(Y,Gd)_3Al_5O_{12}$:Ce (Gd: 15 mol % relative to Y). The raw materials were added to a ball mill together with ethanol, and these materials were grind-mixed for 16 hours. The resultant slurry was dried and formed into granules. The granules were formed into a compact, and the compact was fired in an air atmosphere at 1, 600° C. for 10 hours, to thereby yield a sintered body. The sintered body was ground by means of an alumina mortar and then subjected to classification, to thereby prepare a powder having a mean particle size of 1 to 2 μm.

The resultant powder and alumina powder were mixed in predetermined proportions so as to achieve a composition of sample No. 7. These powder materials were added to a ball mill together with ethanol, and these materials were grind-mixed for 16 hours. The resultant slurry was dried and formed into granules. The granules were formed into a compact, and the compact was fired in an air atmosphere at 1,600° C. for 10 hours, to thereby yield a sintered body (i.e., sample No. 7 shown in Table 1).

Sample No. 7 was evaluated in the same manner as in Example 1. The results are shown in Table 2 below.

As is clear from Table 2, Y is not present in the $Al_2O_3$ crystal grain adjacent to the first crystal grain boundary in sample No. 7. Thus, this sample is not preferred in view that it exhibits an internal quantum, efficiency of 90, an emission intensity of 95, and an LD output tolerance of 23 $W/mm^2$ (evaluated as “Fail”) (i.e., high likelihood of temperature quenching).

Example 2

Optical wavelength conversion members (samples Nos. 8 to 10) were prepared under the conditions shown in Table 1 below. Specifically, optical wavelength conversion members (samples Nos. 8 to 10) were prepared, through reaction sintering.

Basically, each sample was prepared through the same procedure as in Example 1. However, materials used in Example 2 are slightly different from those used in Example 1. The difference will now be described.

Specifically, $Al_2O_3$ powder (mean particle size: 0.2 μm), $Y_2O_3$ powder (mean particle size: 1.2 μm), and $CeO_2$ powder (mean particle size: 1.5 μm) were weighed so as to achieve the composition of the ceramic sintered body of sample No. 8 shown, in Table 1, to thereby prepare a powder for sample No. 8.

Separately, $Al_2O_3$ powder (mean, particle size: 0.2 μm), $Y_2O_3$ powder (mean particle size: 1.2 μm), $Lu_2O_3$ powder (mean particle size: 0.9 μm), and $CeO_2$ powder (mean particle size: 1.5 μm) were weighed so as to achieve the composition of the ceramic sintered body of sample No. 9 shown, in Table 1, to thereby prepare a powder for sample No. 9.

Separately, $Al_2O_3$ powder (mean particle size: 0.2 μm), $Y_2O_3$ powder (mean particle size: 1.2 μm), $Sc_2O_3$ powder (mean particle size: 0.9 μm), and $CeO_2$ powder (mean particle size: 1.5 μm) were weighed so as to achieve the composition of the ceramic sintered body of sample No. 10 shown in Table 1, to thereby prepare a powder for sample No. 10.

In the same manner as in Example 1 above, samples Nos. 8 to 10 were prepared from the powders for samples Nos. 8 to 10, and the samples were evaluated. The results are shown in Table 2 below.

As is clear from Table 2, Y is present in the $Al_2O_3$ crystal grain adjacent to the first crystal grain boundary in samples Nos. 8 to 10.

Although not shown in Table 2, the presence of Lu (sample No. 9) or Sc (sample No. 10) was also confirmed in the $Al_2O_3$ crystal grain adjacent to the first crystal grain boundary.

Y, Lu, and Sc (which are element X) were found to be present in a region extending inward from the surface of the $Al_2O_3$ crystal grain by a distance of 25 nm or less; i.e., a plurality of types of element X were dispersively present in this region. For example, element X was present at a position inward from the surface of the $Al_2O_3$ crystal grain by a distance of 2 nm.

Samples Nos. 8 to 10 are preferred in view that they exhibit an internal quantum efficiency of 100 or more, a high emission intensity of 100 or more, and an LD output tolerance of more than 50 W/mm$^2$ (i.e., low likelihood of temperature quenching).

Samples Nos. 8 to 10 are preferred in view that they exhibit an open porosity of 0.02% or less and a high relative density of 99% or more,

TABLE 1

| No. | Ex. | Production method | X | B | $Al_2O_3$ content (vol %) | $X_3B_5O_{12}$:Ce content (vol %) | Ion other than Y in X | Non Y ion amount in X (mol %) | Ce content (mol %) |
|---|---|---|---|---|---|---|---|---|---|
| 1 | Ex. 1 | Reaction sintering | Y, Gd | Al | 70 | 30 | Gd | 15 | 0.3 |
| 2 | | | Y, Gd | Al | 70 | 30 | Gd | 15 | 0.3 |
| 3 | | | Y, Gd | Al | 70 | 30 | Gd | 15 | 0.3 |
| 4 | | | Y, Gd | Al | 70 | 30 | Gd | 15 | 0.3 |
| 5 | | | Y, Gd | Al | 70 | 30 | Gd | 15 | 0.3 |
| 6 | | | Y, Gd | Al | 70 | 30 | | 15 | 0.3 |
| 7 | Comp. Ex. 1 | Mixing system | Y, Gd | Al | 70 | 30 | Gd | 15 | 0.3 |
| 8 | Ex. 2 | Reaction sintering | Y | Al | 70 | 30 | No addition | | 0.3 |
| 9 | | | Y, Lu | Al | 70 | 30 | Lu | 15 | 0.3 |
| 10 | | | Y, Sc | Al | 70 | 30 | Sc | 15 | 0.3 |

TABLE 2

| No. | Ex. | Production method | Firing temperature | Firing time (hr) | Temperature lowering rate (° C./min) | Open porosity (%) | Presence of Y by EDS | Position of Y substitution | Internal quantum efficiency | LD output tolerance | Emission intensity |
|---|---|---|---|---|---|---|---|---|---|---|---|
| 1 | Ex. 1 | Reaction sintering | 1600 | 10 | 10 | 0.02 | Presence | 0.5 | 98 | Fair | 118 |
| 2 | | | 1600 | 10 | 30 | 0.02 | Presence | 1 | 104 | Good | 124 |
| 3 | | | 1600 | 10 | 60 | 0.02 | Presence | 5 | 110 | Good | 130 |
| 4 | | | 1600 | 10 | 90 | 0.02 | Presence | 10 | 108 | Good | 126 |
| 5 | | | 1600 | 10 | 100 | 0.02 | Presence | 20 | 106 | Good | 123 |
| 6 | | | 1600 | 10 | 200 | 0.02 | Presence | 25 | 97 | Fair | 96 |
| 7 | Comp. Ex. 1 | Mixing system | 1600 | 10 | — | 2 | Absence | — | 90 | Fail | 95 |
| 8 | Ex. 2 | Reaction sintering | 1600 | 10 | 30 | 0.01 | Presence | 5 | 115 | Good | 125 |
| 9 | | | 1600 | 10 | 30 | 0.01 | Presence | 5 | 112 | Good | 122 |
| 10 | | | 1600 | 10 | 30 | 0.02 | Presence | 5 | 109 | Good | 118 |

3. Other Embodiments

Needless to say, the present disclosure is not limited to the aforementioned embodiments, but may be implemented in various other forms without departing from the scope of the disclosure.

(1) For example, a sample was prepared through firing in air in the Examples described above. However, a sample having the same performance as that of the Examples can be prepared through another firing technique, such, as hot press firing, vacuum firing, firing in a reductive atmosphere, HIP, or any combination of these.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) No particular limitation is imposed on the light-emitting element used in the light-emitting device. The light-emitting element may be any known element, such as an LED or LD.

(4) In the aforementioned embodiments, the function of a single component may be shared by a plurality of components, or a single component may exert the functions of a plurality of components. Some of the components in the aforementioned embodiments may be omitted. At least some of the components in the aforementioned embodiments may be, for example, added to or replaced with components in another embodiment. Embodiments of the present disclosure encompass any form included in technical ideas specified by the appended claims.

What is claimed is:

1. An optical wavelength conversion member comprising a polycrystalline ceramic sintered body containing, as main components, $Al_2O_3$ crystal grains and crystal grains represented by formula $X_3Al_5O_{12}$:Ce, wherein X of $X_3Al_5O_{12}$:Ce is at least one element selected from the following element group:

X: lanthanoids (except for Ce), Y, and Sc; and atoms of element X are present also in an $Al_2O_3$ crystal grain adjacent to the interface between the $Al_2O_3$ crystal grain and an $X_3Al_5O_{12}$:Ce crystal grain, wherein said atoms of element X are present at depths of 1 nm to 20 nm as measured from the surface of the $Al_2O_3$ crystal grain adjacent to the interface.

2. A light-emitting device comprising an optical wavelength conversion member as recited in claim 1 and a light-emitting element.

* * * * *